United States Patent
Siiman et al.

(10) Patent No.: US 8,399,155 B1
(45) Date of Patent: Mar. 19, 2013

(54) PRODUCTION OF HIGH EFFICIENCY DIFFRACTIVE AND REFRACTIVE OPTICAL ELEMENTS IN MULTICOMPONENT GLASS BY NONLINEAR PHOTO-IONIZATION FOLLOWED BY THERMAL DEVELOPMENT

(75) Inventors: Leo A. Siiman, Davie, FL (US); Julien Lumeau, Orlando, FL (US); Larissa Glebova, Orlando, FL (US); Vadim I. Smirnov, Orlando, FL (US); Leonid B. Glebov, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 1250 days.

(21) Appl. No.: 11/799,863

(22) Filed: May 3, 2007

Related U.S. Application Data (63) Continuation-in-part of application No. 10/665,339, filed on Sep. 19, 2003, now Pat. No. 7,326,500, which is a continuation-in-part of application No. 09/750,708, filed on Dec. 28, 2000, now Pat. No. 6,673,497, which is a continuation-in-part of (Continued)

(51) Int. Cl.
*G03H 1/02* (2006.01)

(52) U.S. Cl. ............... 430/1; 430/2; 430/290; 359/3

(58) Field of Classification Search .................. None
See application file for complete search history.

(56) References Cited

U.S. PATENT DOCUMENTS

| | | | | |
|---|---|---|---|---|
| 2,515,939 A | * | 7/1950 | Stookey | 430/13 |
| 2,515,940 A | * | 7/1950 | Stookey | 430/13 |
| 2,628,160 A | * | 2/1953 | Stookey | 216/87 |
| 3,208,860 A | * | 9/1965 | Armistead et al. | 501/13 |
| 3,630,765 A | | 12/1971 | Araujo | 501/13 |
| 3,640,604 A | | 2/1972 | Yarnell | 350/162 SF |
| 3,675,990 A | | 7/1972 | Kogelnik et al. | 350/311 |
| 3,923,529 A | * | 12/1975 | Araujo et al. | 501/42 |
| 4,017,318 A | | 4/1977 | Pierson et al. | 501/13 |
| 4,057,408 A | | 11/1977 | Pierson et al. | 65/18 |
| 4,125,404 A | | 11/1978 | Araujo et al. | 501/13 |
| 4,125,405 A | | 11/1978 | Araujo et al. | 501/13 |
| 4,514,053 A | | 4/1985 | Borrelli et al. | 350/162.2 |
| 4,530,736 A | * | 7/1985 | Mutter | 216/26 |
| 4,541,694 A | | 9/1985 | Sullivan et al. | 350/371 |
| 4,567,104 A | | 1/1986 | Wu | 428/410 |
| 4,670,366 A | | 6/1987 | Wu | 430/13 |

(Continued)

OTHER PUBLICATIONS

Akella et al. "Two photon holographic recording in aluminosilicate glass containing silver particles", Opt. Lett., vol. 22(13) pp. 967-969 (Jul. 1997).*

(Continued)

*Primary Examiner* — Martin Angebranndt
(74) *Attorney, Agent, or Firm* — Brian S. Steinberger; Phyllis K. Wood; Law Offices of Brian S. Steinberger, P.A.

(57) ABSTRACT

Apparatus, methods and systems for production of high efficiency refractive and diffractive elements by providing a photo-sensitizer free multicomponent glass, exposing the multi component glass to pulsed laser radiation to produce refractive indexed modulation, and heating the exposed multicomponent silicate glass to produce the high efficiency refractive and diffractive elements. The pulsed laser radiation is infrared femtosecond pulses to ultraviolet nanosecond pulses which provide ionization of glass matrix. The multicomponent glass is a photosensitive glass with high transparency in ultraviolet spectral region, e.g. silicate glass which includes silver, fluorine and bromine and does not contain photosensitizers such as cerium and antimony, PTR glass, cerium free PTR glass and cerium+antimony free PTR glass.

3 Claims, 6 Drawing Sheets

Related U.S. Application Data application No. 09/648,293, filed on Aug. 24, 2000, now Pat. No. 6,586,141.

(60) Provisional application No. 60/174,432, filed on Jan. 4, 2000.

(56) References Cited

U.S. PATENT DOCUMENTS

| | | | | |
|---|---|---|---|---|
| 4,894,303 | A | 1/1990 | Wu | 430/13 |
| 4,946,253 | A | 8/1990 | Kostuck | 350/169 |
| 4,965,152 | A | 10/1990 | Keys et al. | 430/1 |
| 5,078,771 | A | 1/1992 | Wu | 65/30.11 |
| 5,098,803 | A | 3/1992 | Monroe et al. | 430/1 |
| 5,196,282 | A | 3/1993 | Knobbe | 430/2 |
| 5,285,517 | A | 2/1994 | Wu | 385/142 |
| 5,314,522 | A * | 5/1994 | Kondo et al. | 65/31 |
| 5,322,538 | A * | 6/1994 | Kondo et al. | 65/31 |
| 5,339,305 | A | 8/1994 | Curtis et al. | 369/112 |
| 5,374,291 | A * | 12/1994 | Yabe et al. | 65/30.11 |
| 5,486,934 | A | 1/1996 | Huang | 359/15 |
| 5,684,611 | A | 11/1997 | Rakuljic et al. | 359/7 |
| 6,566,626 | B2 | 5/2003 | Gaissinsky et al. | 219/121.69 |
| 6,586,141 | B1 | 7/2003 | Efimov et al. | 430/1 |
| 6,673,497 | B2 | 1/2004 | Efimov et al. | 430/1 |
| 6,710,901 | B2 * | 3/2004 | Pastor | 359/4 |
| 7,326,500 | B1 * | 2/2008 | Glebov et al. | 430/1 |
| 2003/0015509 | A1 | 1/2003 | Gaissinsky et al. | 219/121.85 |
| 2004/0198582 | A1 * | 10/2004 | Borrelli et al. | 501/56 |
| 2005/0207466 | A1 | 9/2005 | Glebov et al. | 372/92 |
| 2009/0062102 | A1 * | 3/2009 | Borrelli et al. | 501/64 |

OTHER PUBLICATIONS

Cheng et al. "Optical gratings embedded in photosensitive glass by photochemical reaction using a femtosecond laser", Opt. Exp. vol. 11(15) pp. 1809-1816 (Jul. 2003).*
Watanabe et al. "Fabrication of fresnel zone plate embedded in silica glass by femtosecond laser pulses", Opt. Exp' vol. 10(19) pp. 978-983 (Sep. 2002).*
Wang et al. "Laser direct write gray level mask and one step etching for diffractive microlens fabrication". Appl. Opt., vol. 37(32) pp. 7568-7576 (Nov. 1998).*
Kondo et al. "Three dimensional arrays of crystallites within glass by using non-resonant femtosecond pulses", J. Non-Cryst. Sol. vol. 253 pp. 143-156 (1999).*
Sato et al. "Fast rewritable computer generated hologram in photochromic material", Holographic systems, components and applications, 1989, second conference proceedings, pp. 218-222 (0989).*
Arimstead et al., "Photochromic silicate glasses sensitized by silver halides", Science 144, pp. 150-154 (Apr. 1964).*
Livingston et al. "effect of laser parameters on the exposure and selective etch rate in photostructurable glass" Proc. SPIE vol. 4637 pp. 404-412 (2002).*
A.P. Gararin, L.B. Glebov, O.M. Efimov, O.S. Efimova, "Formation of color centers in sodium calcium silicate glasses with the nonlinear absorption of powerful UV radiation," *Sov. J. Glass Phys. Chem. 5*, pp. 337-340 (1979).
IBM Tech. Discl. Bull., vol. 31 (3), pp. 18-22, (Aug. 1988).
A.V. Dotsenkoo, L.B. Glebov, V.A. Tsekhomsky, "Physics and Chemistry of Photochromic Glasses," *CRC Press*, Boca Raton, NY., pp. 9-11, (1997).
Efimov, et al., "Laser-induced Damage of Photo-Thermo-Refractive Glasses for Optical-Holographic-Element Writing," *SPIE* vol. 3578, pp. 564-575, (1999).
O.M. Efimov, L.B. Glebov, S. Grantham, M. Richardson, "Photoionization of silicate glasses exposed to IR femtosecond pulses," *Journal of Non-Crystalline Solids*, 253, pp. 58-67. (1999).
O.M. Efimov, L.B. Glebov, H.P. Andre,"Measurement of the induced refractive index in a potothermorefractive glass by a liquid-call shearing interferometer" *Appl. Optics*, 41., pp. 1864-1871 (2002).
P. Hariharan, "Optical Holography Principles, techniques and applications, second edition," *Cambridge University Press*, pp. 95-97.
S. Donald Stookey, George H. Beall, Joseph E. Pierson, "Full-Color Photosensitive Glass," *Journal of Applied Physics*, vol. 49, No. 10, pp. 5114-5123, (Oct. 1978).
Borelli, Morese, Bellman, Morgan, "Photolytic Technique for Producing Mircolenses in Photosensitive Glass," *Applied Optics*, vol. 24, No. 16, pp. 2520-2525, (Aug. 15, 1985).
Borgman, Glebov, Nikonorov, Petrovskii, Savvin, Tsvetkov, "Photothermal Refractive Effect in Silicate Glasses," *Sov. Phys. Dokl*, vol. 34, No. 11, pp. 1011-1013, (Nov. 1989).
Glebov, Nikonorov, Panysheva, Petrovskii, Savvin, Tunimanove, Tsekhomskiir, "Polychromic glasses—A New Material for Recording Volume Phase Hologram," *Sov. Phys. Dokl*, vol. 35, No. 10, pp. 878-880, (Oct. 1990).
Glebov, Nikonorov, Panysheva, Petrovskii, Savvin, Tunimanova, Tsekhomskii, "New Ways to Use Photosensitive Glasses for Recording Volume Phase Holograms," *Opt. Spectrosc.*, vol. 73, No. 2, pp. 237-241, (Aug. 1992).
Glebov, Glebova, Richardson, Smirnov, "Photo-Induced Processes in Photo-Thermo-Refractive Glasses," *XVII International Congress on Glass*, San Francisco, CA, (Jul. 5-10, 1998).
Efimov, Glebov, Glebova, Richardson, Smirnov, "High-Efficiency Bragg Gratings in Photothermorefractive Glass," *Applied Optics*, vol. 38, No. 4, pp. 619-627, (Feb. 1999).
Efimov, Francois-Saint-Cyr, Glebov, Glebova, Richardson, Smirnov, "Photo-Thermo-Refractive Glasses for High Efficiency Bragg Gratings in UV, Visible and IR Regions".
Bukharev, et al, "Recording of holograms on radiation color centers in glass," Pis'ma V Zhurnal Teknicheskoi Fiziki vol. 1(21) pp. 975-977 (1975) (Abstract only).
Seward, "Thermally darkenable photochromic glasses," J. Appl. Phys., vol. 46(2) pp. 689-694 (1975).
Yokota, "Color centers in alkali silicate glasses containing alkaline earth ions," vol. 101 (2) pp. 522-525 (1956).
Anikin, et al, J. Noncryst. Sol, vol. 34 (3), pp. 393-403 (abstract only).
Bukharaev, et al., Physica Status Solidi A: appl. Research vol. 50(2) pp. 711-716 (1978) (abstract only).
Glebov, et al., Doklady Akademii Nauk SSSR vol. 312 (4) pp. 852-854 (1990)(abstract only).
Willaims, "Permanent photowritten optical gratings inirradiated silicate glasses," Opt. Let., vol. 17(7)pp. 532-534 (1992).
L.B. Glebov, "Volume Hologram Recording in Inorganic Glasses" Glass Sci. Technol. 75 CI (2002) pp. 73-90.
O.M. Efimov, L.B. Gebov, H.P. Andre, "Measurement of the induced refractive index in a photothermorefractive glass by a liquid-cell shearing interferometer," Applied Optics, vol. 41, No. 10, Apr. 1, 2002, pp. 1864-1871.
P. Hariharan, "Optical Holography. Principles, techniques, and applications" Chapter 7: "Practical recording materials," 95-124. Cambridge University Press, (1996). p. 95-123.
O.M. Efimov, L.B. Glebov, S. Grantham, M. Richardson,"Photoionization of silicate glasses exposed to IR femtosecond pulses" Journal of Non-Crystalline Solids, 253, pp. 58-67.

* cited by examiner

PRODUCTION OF HIGH EFFICIENCY DIFFRACTIVE AND REFRACTIVE OPTICAL ELEMENTS IN MULTICOMPONENT GLASS BY NONLINEAR PHOTO-IONIZATION FOLLOWED BY THERMAL DEVELOPMENT

This application is a Continuation-in-Part of U.S. patent application Ser. No. 10/665,339 filed on Sep. 19, 2003 now U.S. Pat. No. 7,326,500, which is a Continuation in Part of U.S. patent application Ser. No. 09/750,708 filed Dec. 28, 2000 now U.S. Pat. No. 6,673,497 now allowed, which is a Continuation-In-Part of U.S. patent application Ser. No. 09/648,293 filed Aug. 24, 2000 now U.S. Pat. No. 6,586,141, which claims the benefit of priority to U.S. Provisional Patent Application 60/174,432 filed Jan. 4, 2000, and was funded in part by DARPA contracts HR-01-1041-0004 and HR-0011-06-1-0010.

FIELD OF THE INVENTION

This invention relates to optical elements and, in particular, to methods, systems, apparatus and devices to produce high efficiency diffractive and refractive optical elements in multicomponent glass by nonlinear photo-ionization followed by thermal development which shifts spectrum of photosensitivity of a glass to the long wavelength region for recording of complex phase patterns including Fresnel lenses and nonplanar holograms.

BACKGROUND AND PRIOR ART

The ideal recording material for holography should have a spectral sensitivity well matched to available laser wavelengths, a linear transfer characteristic, high resolution, and low noise, be indefinitely recyclable or relatively inexpensive. While several materials have been studied, none has been found that meets all these requirements. The lack of available materials for phase holograms has stimulated a search for new approaches.

The new approach was described in the co-pending U.S. patent application Ser. No. 10/665,339 filed on Sep. 19, 2003, which teaches how a photo-thermal process based on precipitation of dielectric microcrystals in the bulk of glass exposed to UV radiation can be used to record a high-efficiency volume phase hologram in glass because of a difference between refractive indices of exposed and unexposed areas of glass blank.

According to co-pending '339 application and references cited herein, the first step of the proposed process is the exposure of the glass sample to UV radiation, which produces ionization of a cerium ion. The electrons released from cerium are then trapped by a silver ion. As a result, silver is converted from a positive ion to a neutral atom. This stage corresponds to a latent image formation and no significant coloration or refractive index change occurs. The next step is thermal development.

This development process includes two stages. The first involves the high diffusion rate silver atoms possess in silicate glasses. This diffusion leads to creation of tiny silver containing particles at relatively low temperatures with a range of approximately 450 to approximately 500° C. A number of silver clusters arise in exposed regions of glass after aging at elevated temperatures. These silver particles serve as the nucleation centers for sodium and fluorine ion precipitation and cubic sodium fluoride crystal growth occurs at temperatures between 500° C. and 550° C. Interaction of crystalline phase with glass matrix at elevated temperatures results in decreasing of refractive index in exposed areas compare to that in unexposed ones. This phenomenon was named the "photo-thermo-refractive" (PTR) process. Glasses, which possess such properties, were called "photo-thermo-refractive" (PTR) glasses.

Conditions of glass technology, exposure, and development were found in that work to create volume holographic gratings referred to as Bragg gratings, with relative diffraction efficiency up to approximately 97%. The maximum recorded spatial frequency was about 10,000 mm$^{-1}$ and the gratings are stable up to approximately 400° C. The photosensitivity was found in the range of several hundred mJ/cm$^2$ at a helium-cadmium laser wavelength of approximately 325 nm. The absorption band of $Ce^{3+}$, which is used for photoionization, has a maximum wavelength at approximately 300 nm and a long wavelength tale up to approximately 350 nm. This means that several commercial lasers such as $N_2$, Ar, He—Cd, etc., can be used for recording. Once developed, holograms in PTR glass are not destroyed by further exposure to UV, IR or visible light. These properties of PTR holographic elements resulted in wide application of this technology for different laser systems operating in visible and near IR spectral regions.

The most important applications of holographic optical elements require nonplanar holograms working in visible and near IR regions. Such elements, if used as selective focusing, defocusing, correlating, etc. components, can dramatically decrease sizes, weight, and cost of laser and optical systems. However, nonplanar holograms can only be reconstructed by the same wavelength that was used in the recording process. This means that by linear photosensitivity, complex PTR holograms can only be done in the UV region within the absorption band of cerium which is placed in the short wavelength region less than 350 nm.

The co-pending '339 parent patent application teaches how to extend sensitivity of PTR glass to the visible region by the use of two-step exposure to low power UV radiation followed by high power visible radiation. This method teaches generation of latent images by a conventional continuous wave UV irradiation followed by nonlinear bleaching of this latent image by high power visible radiation. However, no sensitivity was observed for longer wavelengths.

At longer wavelengths of illumination, PTR glass is transparent and shows no linear photosensitivity. In contrast, exposure to high intensity laser pulses at wavelengths longer than the linear photosensitivity edge of PTR glass can excite PTR glass by nonlinear mechanisms. It is shown in O. M. Efimov, L. B. Glebov, S. Grantham, M. Richardson, Photoionization of silicate glasses exposed to IR femtosecond pulses, Journal of Non-Crystalline Solids, 253, (1999) pp. 58-67 that exposure of PTR glass to high intensity infrared femtosecond pulses causes photoionization and subsequent refractive index change after thermal development. The co-authors of the publication noticed that refractive index change occurred by observation of microscope photographs of channels formed inside bulk PTR glass. However, no real attention was given to this phenomenon. First of all, no characterization of the amount of refractive index change was carried out. In addition, the co-authors did not investigate the sign of refractive index change, i.e. if it appears as refractive index decrement due to the photo-thermo-refractive process or refractive index increment due to glass densification.

Because the nonlinear processes involved in exciting PTR glass under femtosecond exposure produces photoionization of the glass matrix directly, it is unnecessary for certain dopants to be included in the standard PTR glass composition. In Y. Kondo, K. Miura, T. Suzuki, H. Inouye, T. Mitsuyu, K. Hirao, Three-dimensional arrays of crystallites within glass by using non-resonant femtosecond pulses, Journal of Non-Crystalline Solids, 253, (1999) pp. 143-156 it was shown that a photosensitive glass similar to PTR glass but without cerium can be photoionized by exposure to IR femtosecond pulses and crystallized after thermal development. But because the precipitated crystals were large in size (about 8 µm in diameter) this glass had high scattering and absorption and therefore could not be used for the recording of high efficiency refractive or diffractive elements. Furthermore, the co-authors tried to ionize their PTR-like glass with nanosecond pulses but were unsuccessful. Photosensitivity of PTR glass to nanosecond pulses has not been previously reported. However photoionization of high purity alkali-silicate glasses by UV nanosecond pulses is described in Gagarin, A. P., Glebov, L. B., Efimov, O. M., and Efimova, O. S., Formation of color centers in sodium calcium silicate glasses with the nonlinear absorption of powerful UV radiation, Sov. J. Glass Phys. Chem., 5, pp. 337-340 (1979).

SUMMARY OF THE INVENTION

A primary objective of the invention is to provide apparatus, methods, systems and devices for production of high efficiency refractive and diffractive elements based on refractive index modification resulted from exposure of a multi-component glass including PTR glass, to IR femtosecond pulses of laser radiation followed by thermal treatment.

A secondary objective of the invention is to provide apparatus, methods, systems and devices for production of high efficiency refractive and diffractive elements based on refractive index modification resulted from exposure of a multi-component glass including PTR glass, to UV nanosecond pulses of laser radiation followed by thermal treatment.

A third objective of the invention is to provide apparatus, methods, systems and devices for hologram recording in a multi-component silicate glass which includes silver, fluorine and bromine but does not contain photosensitizes, e.g. cerium.

A fourth objective of the invention is to provide apparatus, methods, systems and devices for photosensitive glass for refractive and diffractive elements recording with high transparency in UV spectral region.

A fifth objective of the invention is to provide apparatus, methods, systems and devices for hologram recording by interference of two or several laser beams, IR femtosecond or UV nanosecond pulses.

A sixth objective of the invention is to provide apparatus, methods, systems and devices for phase Fresnel optical elements produced by spatial refractive index modulation resulted from scanning or masking of pulsed laser radiation.

A seventh objective of the invention is to provide apparatus, methods, systems and devices to produce direct photo-ionization of a multicomponent silicate glass including PTR glass, followed by proper thermal treatment which results in nano-crystalline phase precipitation and consequent refractive index decrement.

An eighth objective of the invention is to provide apparatus, methods, systems and devices to produce high efficiency diffractive and refractive optical elements in multi-component silicate glass by nonlinear photo-ionization followed by thermal development when spectrum of photosensitivity of a glass is shifted to the long wavelength region for recording complex phase patterns including Fresnel lenses and nonplanar holograms.

A ninth objective of the present invention is to provide apparatus, methods, systems and devices for the fabrication of complex holographic elements for applications in complex optical systems including laser radars, tracking systems and high-power lasers, optical communications including transmitters and receivers and WDM filters.

A first preferred embodiment of the invention provides a method of production of high efficiency refractive and diffractive elements by providing a photo-sensitizer free multi component silicate glass, exposing the multi component glass to pulsed laser radiation to produce refractive indexed modulation, and heating the exposed multi component silicate glass to produce the high efficiency refractive and diffractive elements. The pulsed laser radiation is infrared femtosecond pulses of laser radiation or ultraviolet nanosecond pulses of laser radiation. The multi component silicate glass is a photosensitive glass with high transparency in ultraviolet spectral region, silicate glass which includes silver, fluorine and bromine and does not contain photosensitizers such as cerium and antimony, PTR glass, cerium free PTR glass and cerium+antimony free PTR glass.

The exposing step includes scanning the cerium-free or cerium+antimony free PTR glass with a focused femtosecond beam to produce a low-spatial-frequency transmitting Bragg grating or phase Fresnel lens due to refractive index change in exposed areas. In an embodiment, the exposing step includes masking the photo-sensitizer free multi-component silicate glass and exposing the masked photo-sensitizer free multi component glass with the pulsed laser radiation to produce a phase Fresnel optical element by spatial refractive index modulation resulting from the masking and exposing. Another embodiment includes scanning the photo-sensitizer free multi-component silicate glass with the pulsed laser radiation to produce a phase Fresnel optical element by spatial refractive index modulation.

Further objects and advantages of this invention will be apparent from the following detailed description of preferred embodiments which are illustrated schematically in the accompanying drawings.

BRIEF DESCRIPTION OF THE FIGURES

FIG. 7b shows the diffraction of a He—Ne laser beam at 633 nm from the grating shown in FIG. 7a.

DESCRIPTION OF THE PREFERRED EMBODIMENTS

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The apparatus, methods and systems of the present invention extend sensitivity of PTR glass to longer wavelengths by nonlinear excitation of PTR glass by pulsed laser sources for fabrication of complex holographic elements for application as narrow-band lenses, mirrors and other optical components for high-quality laser systems. Applications for the complex holographic elements include military optical systems such as laser radars, tracking systems and high-power lasers and optical communications including transmitters and receivers and WDM filters. The list of applications is an example of uses for the optical components according to the present invention and is not intended as a limitation, other applications will be obvious to those skilled in the art.

The process of production of high efficiency diffractive and refractive optical elements in multicomponent silicate glass by nonlinear photo-ionization followed by thermal development is based on recently discovered phenomenon that photo-thermo-induced crystallization of silicate glasses can be driven by nonlinear photoionization by means of IR femtosecond pulses and UV nanosecond pulses of laser radiation. This process results in refractive index decrement in exposed areas after exposure to high intensity laser pulses and thermal development. Refractive index modulation up to 1000 ppm is feasible, while the small size of the precipitated crystalline phase provides low scattering and, consequently fabrication of high efficiency refractive and diffractive optical elements. For example, volume diffractive gratings and phase Fresnel lenses are described.

Figure 1:
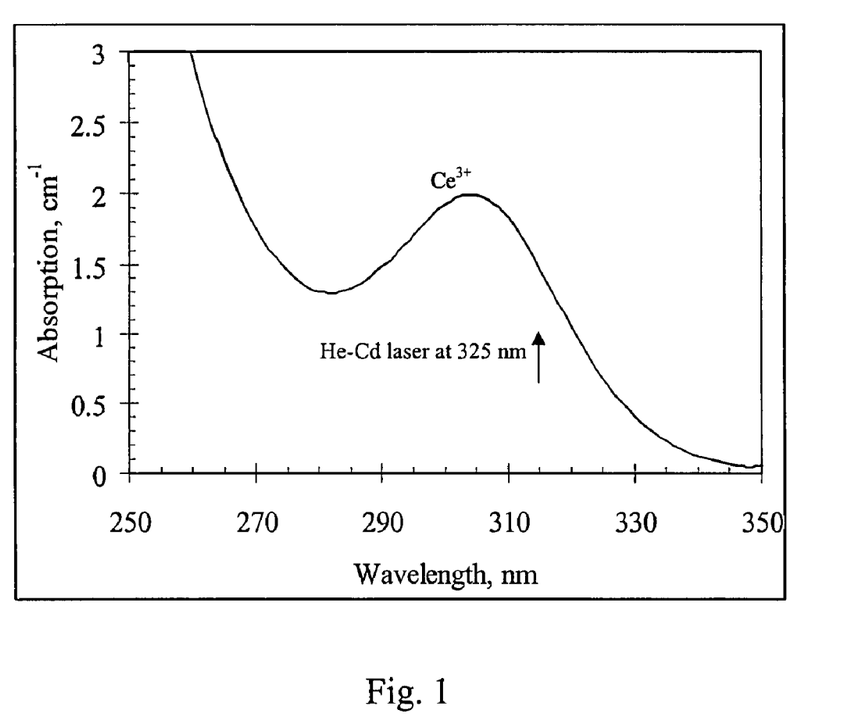
FIG. 1 is a graph showing the absorption spectrum of PTR glass.

Absorption spectrum of PTR glass is shown in FIG. 1 and described in U.S. Pat. No. 6,586,141 which is incorporated herein by reference hereto. An absorption band having a maximum at approximately 305 nm belongs to $Ce^{3+}$ which is one of the components of the PTR glass. Excitation of cerium to an upper state triggers photo and thermo-induced processes that result in refractive index decrement. The standard writing wavelength is described as approximately 325 nm which is placed at the long-wavelength tail of $Ce^{3+}$ absorption band as shown on the graph in FIG. 1. As shown, no additional absorption bands can be seen in the visible region above 350 nm. It was found in several experiments that exposure of this glass by low-intensity light with wavelengths exceeding approximately 350 nm did not cause refractive index decrement. Co-pending U.S. patent application Ser. No. 10/665,339 filed on Sep. 19, 2003 teaches how to shift photosensitivity of PTR glass to visible region by two-step illumination with UV and high power visible irradiation.

Photo-thermo-refractive glass for experiments was melted by a two-step process in an electrical furnace. A detailed description of PTR glass composition, melting and mechanism is given in 3. L. B. Glebov. Volume hologram recording in inorganic glasses. Glass Science and Technology 75 C1 (2002), pp. 73-90. Samples of regular PTR glasses were exposed to radiation of femtosecond pulses of Ti: sapphire laser at approximately 783 nm and nanosecond pulses of a third harmonic of Nd:YAG laser at approximately 355 nm. The dosage of exposure was controlled by placing the PTR glass sample on a computer controlled translation stage and scanning across the high-intensity laser beam at a fixed velocity v. For scanning along the x-axis this exposure results in a line with dosage given by $$D(x, y) = \sqrt{\frac{2}{\pi}} \cdot \frac{E_p \cdot R}{v \cdot w} \cdot e^{-2\frac{y^2}{w^2}}$$

where $E_p$ is the energy per pulse [Joules/pulse], R is the repetition rate of the laser [pulses/sec], v is the scanning velocity [m/s] and w is the beam waist, $HWe^{-2}M$, [m]. This equation is valid for pulses with Gaussian spatial distribution of energy and for scanning conditions that obey v/R<w. Knife-edge measurements were performed to determine the beam waist w and to confirm that the beam spot profile was close to Gaussian.

After the exposure to a linear pattern with lateral Gaussian profile of intensity, PTR glass samples were thermally developed for 2 hours at 520° C. to produce nucleation and growth of sodium fluoride crystals. The photoinduced refractive index change of each line was measured using a liquid cell shearing interferometer setup with accuracy of about 1 ppm as described in O. M. Efimov, L. B. Glebov, H. P. Andre, Measurement of the induced refractive index in a photo-thermo-refractive glass by a liquid-cell shearing interferometer, Appl. Optics, 41 (2002), pp. 1864-1871. By scanning several lines produced by irradiation with different intensities $(W/cm^2)$ and dosages $(J/cm^2)$, photosensitivity curves were constructed as shown in FIGS. 2 through 5.

A Ti:sapphire regenerative amplifier is used as the source of IR femtosecond pulses. The amplifier specifications were central wavelength at 783 nm, pulse duration of about 120 fs, and pulse energies up to 1 mJ. A Nd:YAG laser operating at third harmonic of approximately λ=355 nm was used as the source of UV nanosecond pulses. The pulse duration was approximately 8 ns and pulse energies ranged up to approximately 4 mJ.

Figure 2:
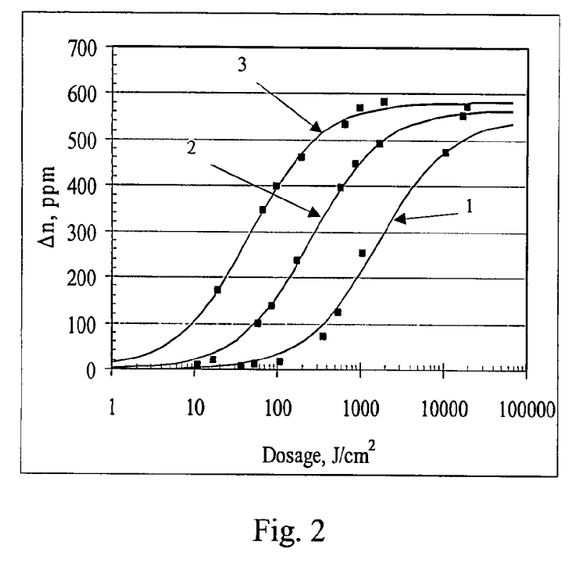
FIG. 2 is a graph showing that the maximum refractive index changes as a function of laser dosage for different intensities: (1) 1.9 TW/cm$^2$ (2) 3.1 TW/cm$^2$ and (3) 3.5 TW/cm$^2$.
Figure 3:
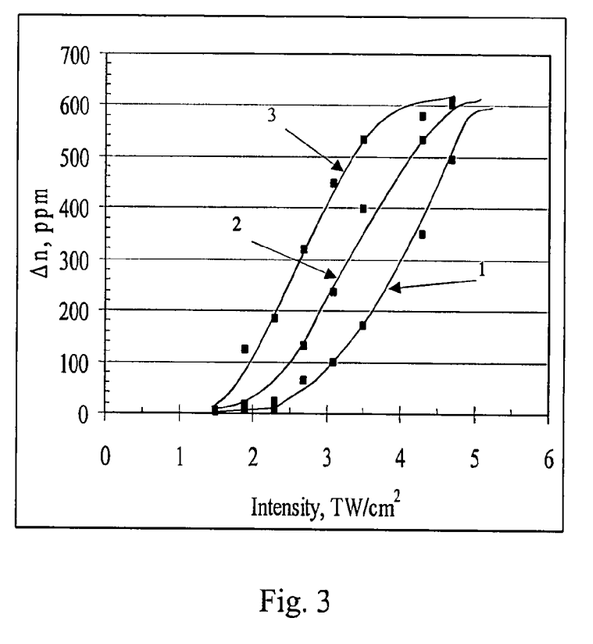
FIG. 3 is a graph showing that the maximum refractive index changes as a function of intensity for different dosages: (1) 25 J/cm$^2$, (2) 130 J/cm$^2$, and (3) 860 J/cm$^2$.

For an intensity of laser radiation exceeding a specific value, photo-thermo-induced refractive index decrement is detected. FIG. 2 shows the refractive index change (Δn) as a function of dosage of femtosecond irradiation plotted on a log scale for dosage and therefore extends across a wide range. The refractive index change is shown for three different power densities, 1.9 $TW/cm^2$ plotted as graph 1, 3.1 $TW/cm^2$ plotted as graph 2 and 3.5 $TW/cm^2$ plotted as graph 3. In contrast, refractive index change Δn as a function of intensity of femtosecond pulses at different dosages is shown in FIG. 3 plotted on a linear scale. FIG. 3 shows a sharp threshold onset which then quickly reaches saturation for 25 $J/cm^2$ plotted on graph 1, 130 $J/cm^2$ plotted on graph 2 and 860 $J/cm^2$ plotted on graph 3.

Figure 4:
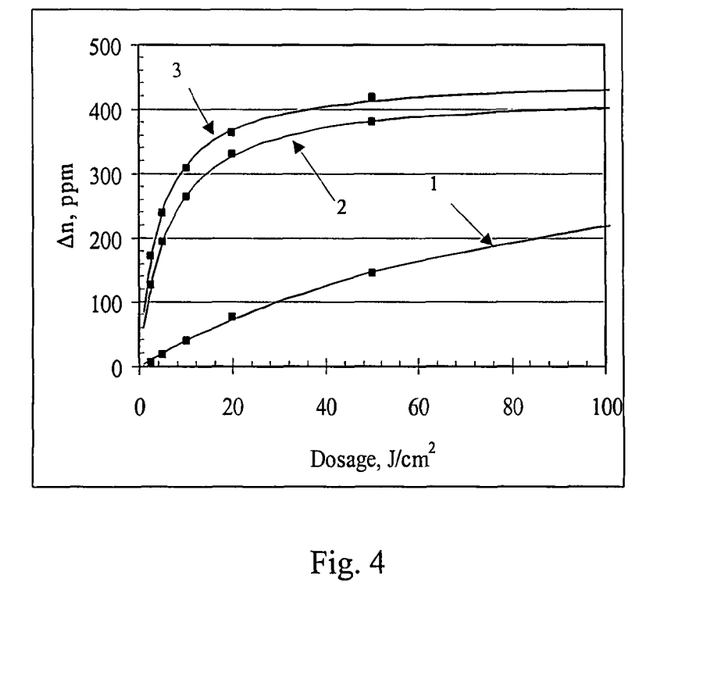
FIG. 4 is a graph showing that the maximum refractive index changes as a function of dosage for different intensities (1) 2.5 MW/cm$^2$ (2) 20 MW/cm$^2$ and (3) 100 MW/cm$^2$. Wavelength 355 nm, pulse duration 8 ns, spot diameter 520 µm.
Figure 5:
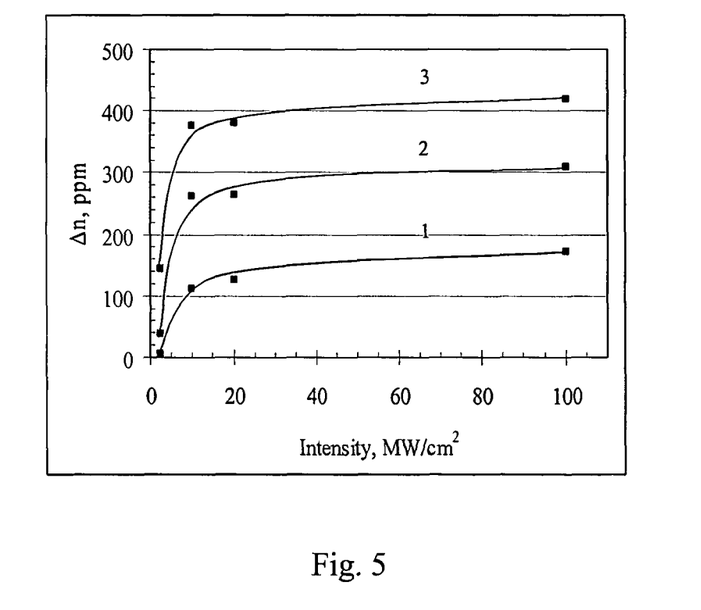
FIG. 5 is a graph showing that the maximum refractive index changes as a function of intensity for different dosages: (1) 2.5 J/cm$^2$ (2) 10 J/cm$^2$ and (3) 50 J/cm$^2$. Wavelength 355 nm, pulse duration 8 ns, spot diameter 520 µm.

FIGS. 4 and 5 are graphs showing the photosensitivity of PTR glass to UV nanosecond pulses. In FIG. 4, the refractive index change versus dosage is shown for three different power densities, 2.5 $MW/cm^2$ plotted on graph 1, 20 $MW/cm^2$ plotted as graph 2 and 100 $MW/cm^2$ plotted on graph 3 at a wavelength of approximately 355 nm, a pulse duration of approximately 8 ns and an approximately 250 μm spot diameter. In FIG. 5, the refractive index change versus power density is shown for three different dosages 25 $J/cm^2$ plotted on graph 1, 130 J/cm² plotted on graph 2 and 860 J/cm² plotted on graph 3 at a wavelength of approximately 355 nm, a pulse duration of approximately 8 ns and an approximately 250 μm spot diameter. Refractive index change by both femtosecond and nanosecond pulses is a refractive index decrement and therefore the process of nonlinear excitation is similar to the process of refractive index change after linear excitation of PTR glass.

Figure 6:
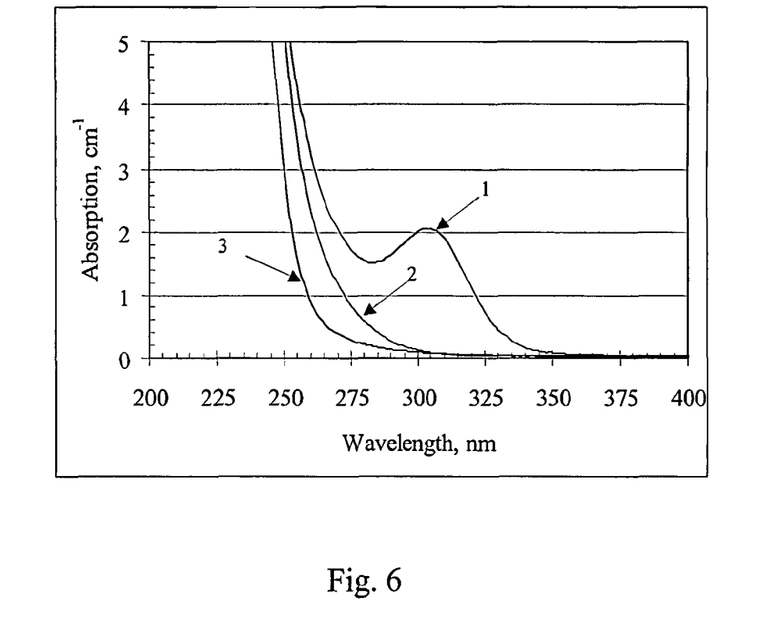
FIG. 6 is a graph showing a comparison of the absorption spectra of regular PTR glass, PTR glass without cerium and PTR glass without cerium and antimony.

It was found, in contradiction to linear and two-step methods of irradiation described in U.S. Pat. No. 6,586,141 and U.S. patent application Ser. No. 10/665,339 both assigned to the same assignee as the subject application, that the presence of a photo-sensitizer (cerium) is not necessary for nonlinear single-step photosensitivity. Cerium free PTR glass and cerium+antimony free PTR glass were melted under the same conditions as regular PTR glasses. The absorption spectra of regular PTR glass shown as graph 1, PTR glass without cerium shown as graph 2, and cerium+antimony free PTR glass shown as graph 3 in FIG. 6. As shown, cerium has an absorption band centered at approximately 305 nm and therefore the transparency range of cerium free PTR glass extends deeper into ultraviolet. Likewise antimony has an absorption band centered at approximately 250 nm therefore removing antimony further increases the transparency range of virgin PTR glass.

Photosensitivity of both new types of PTR glass was tested using the same method previously described. Similar refractive index changes as high as 1000 ppm were measured in all types of PTR glasses. Cerium+antimony free PTR glass showed faster crystallization than other types of PTR glasses but same optical properties if developed under proper conditions, such as lower temperature. Thus, photoionization of multicomponent silicate glass and, therefore, generation of a latent image for the further phase recording can be done in glass possessing photo-thermo-induced crystallization. This process is based on the direct ionization of the glass matrix and does not require introducing photo-sensitizers in the glass composition.

Figure 7A:
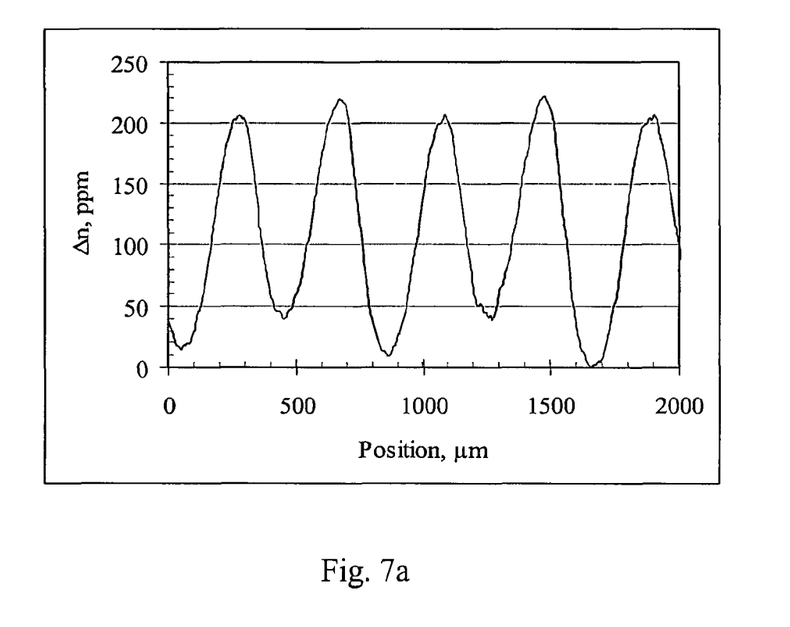
FIG. 7a is a graph of the refractive index profile of a grating.
Figure 7B:
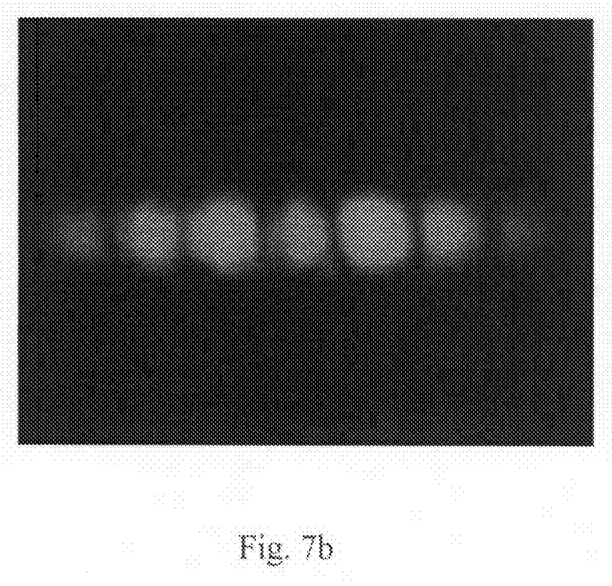

The photosensitivity curves shown in FIGS. 2 through 5 enabled design and fabrication of optical elements with desired refractive index variations. Exposure to femtosecond pulses can be used for fabrication of different types of phase patterns and, therefore, different types of optical elements. As example, such exposure was used to fabricate two different phase optical elements. The first was a low-spatial-frequency transmitting Bragg grating in PTR glass without cerium. The second was a linear phase zone plate recorded in regular PTR glass. The grating was recorded by scanning a focused femtosecond beam with beam waist of ~170 μm, intensity ~3 TW/cm², and dosage ~100 J/cm². Lines were spaced ~350 μm apart. The glass was then thermally developed for 2 hours at 515° C. After development the spatial period and refractive index modulation were measured with a shearing interferometer, results are shown in FIG. 7a. Maximum refractive index was measured at approximately 200 ppm and grating period of approximately 380 μm. Diffraction of He—Ne laser beam at the recorded pattern is shown in FIG. 7b. One can see that this device where period is comparable to thickness behaves as a thin Bragg grating showing a number of orders of diffraction. Gratings can also be fabricated in PTR glasses by holographic recording using high intensity laser pulses.

Figure 8:
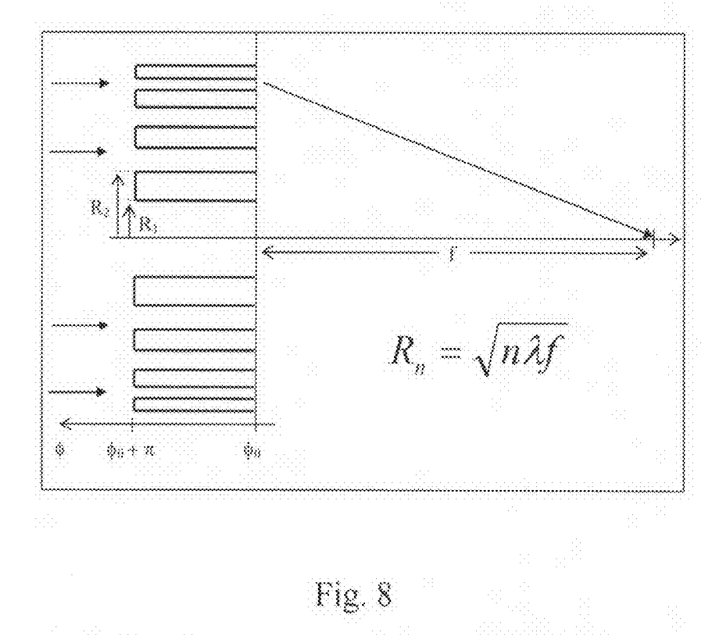
FIG. 8 shows a structure of a linear phase reversal zone plate according to the present invention.

A linear phase reversal zone plate (cylindrical Fresnel lens) was recorded in the same manner by scanning of a focused beam of a femtosecond laser. The typical structure of the phase element is shown in FIG. 8 which shows a structure of a linear phase reversal zone plate. As shown, the element includes several areas with the phase shift between the areas being approximately equal to π. This phase shift can be controlled by either thickness variation or refractive index variation. In our case we alter the refractive index in PTR glass to achieve π phase shift between zones. This is the first prototype of new type of Fresnel lens using PTR glass. The parameters of the cylindrical lens are designed to have nine zones and a focal length of 4 m when using 633 nm light. The lens was fabricated by exposing PTR glass to focused femtosecond radiation with beam waist of approximately 170 μm, intensity of approximately 3 TW/cm², and dosage of approximately 100 J/cm². The glass is then thermally developed for 1 hour at 515° C.

Figure 9A:
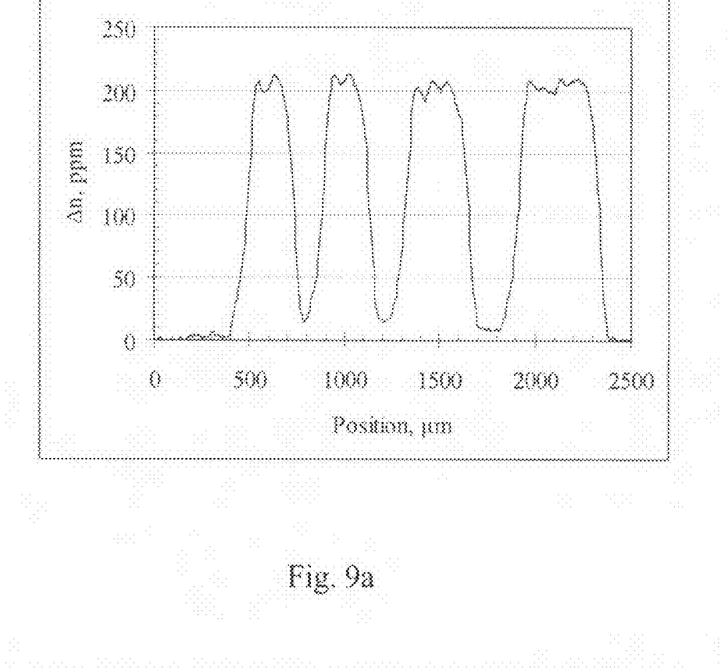
FIG. 9a is a graph of the refractive index profile of four zones of cylindrical Fresnel lens according to the present invention.
Figure 9B:
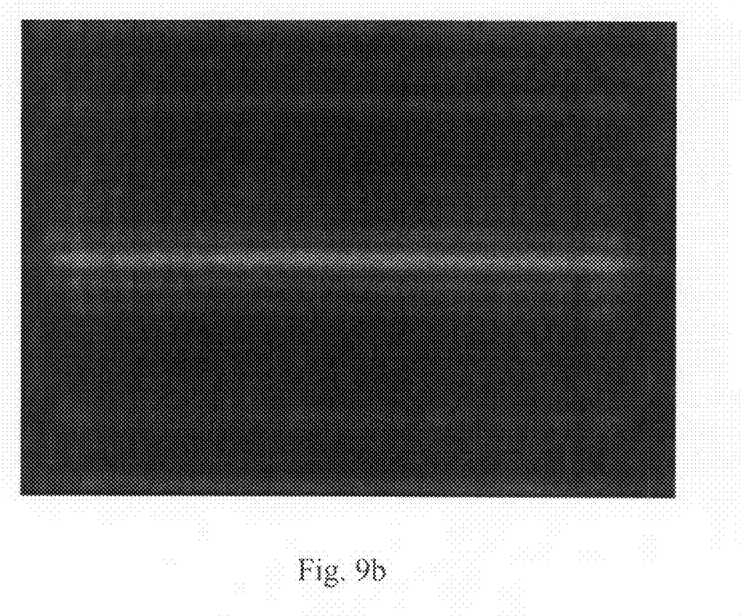
FIG. 9b shows a collimated He—Ne laser beam at 633 nm after focusing by cylindrical Fresnel lens according to the present invention.

Refractive index change in the exposed areas was measured by the shearing interferometer to be approximately 200 ppm as shown in FIG. 9a. Because the thickness of the glass was approximately 1.8 mm, this refractive index change Δn corresponds to a phase shift of approximately π between zones. The lens was then placed in a collimated beam of a He—Ne laser, and a picture of the beam at the focal plane is shown in FIG. 9b. FIG. 9b shows that phase patterns can be fabricated by photo-induced refractive index change in PTR glasses by a single-step nonlinear excitation. An advantage of femtosecond exposure compared to linear or two-step nonlinear exposure is that very sharp transitions as shown in FIG. 9a is obtained between phase zones due to the high nonlinearity of the process. Moreover, the efficiency of this fabricated element was limited by its simple design. By apodizing this lens, higher efficiency can be obtained. In conclusion, the use of non-linear photosensitivity of PTR glass paves a way to the recording of high efficiency phase masks.

In summary, the present invention provides a new methods, systems, apparatus, and devices for extending sensitivity of PTR glass to longer wavelengths by nonlinear excitation of PTR glass by pulsed laser sources. Fabrication of complex holographic elements opens new great areas of narrow-band lenses, mirrors and other optical components for high-quality laser systems. Applications of those elements in military optical systems (laser radars, tracking systems, high-power lasers, etc.); optical communications (transmitters and receivers, WDM filters, etc.) and other markets should be extremely beneficial.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method for production of high efficiency refractive and diffractive optical elements in a glass for recording phase patterns consisting essentially of the steps of:
   providing a photo-sensitizer free, multi-component glass matrix having photo-thermo-induced crystallization;
   exposing the photo-sensitizer free multi component glass to ultraviolet nanosecond pulses of laser radiation to produce photoionization of the glass matrix; and
   heating to thermally develop the photoionized glass matrix, thereby modifying the refractive index of the glass matrix and producing high efficiency refractive and diffractive optical elements which, based upon the modification of the refractive index, form phase patterns in the thermally developed photoionized glass matrix.

2. A method for production of high efficiency refractive diffractive optical elements in a glass for recording phase patterns consisting essentially of the steps of:

providing a photo-sensitizer free, multi-component glass matrix having photo-thermo-induced crystallization;

recording a phase hologram in the thermally developed photoionized glass matrix by interference of two or more ultraviolet nanosecond pulsed laser beams to produce photoionization of the glass matrix; and heating to thermally develop the photoionized glass matrix, thereby modifying the refractive index of the glass matrix and producing high efficiency refractive and diffractive optical elements which, based upon the modification of the refractive index, form phase patterns in the thermally developed photoionized glass matrix.

3. A method for extending the sensitivity of PTR glass to a wavelength in a range of approximately 355 nm consisting of the steps of:

selecting a photo-sensitizer free photo-thermo-refractive (PTR) glass matrix having photo-thermo-induced crystallization;

exposing the photo-sensitizer free PTR glass matrix to nonlinear excitation with a UV nanosecond pulsed laser source to produce photoionization of the glass matrix; and thereafter heating to thermally develop the photoionized glass matrix, thereby modifying the refractive index of the glass matrix and producing high efficiency refractive and diffractive optical elements which based upon the modification of the refractive index forms phase patterns in the thermally developed photoionized PTR glass matrix.

* * * * *